United States Patent [19]
Larsen et al.

[11] Patent Number: 5,692,147
[45] Date of Patent: Nov. 25, 1997

[54] MEMORY MAPPING METHOD AND APPARATUS TO FOLD SPARSELY POPULATED STRUCTURES INTO DENSELY POPULATED MEMORY COLUMNS OR ROWS BY SELECTIVELY TRANSPOSING X AND Y ADDRESS PORTIONS, AND PROGRAMMABLE GATE ARRAY APPLICATIONS THEREOF

[75] Inventors: Wendell Ray Larsen, Essex Junction; Frank Ray Keyser, Colchester; Brian A. Worth, Milton, all of Vt.

[73] Assignee: International Business Machines Corporation, Armonk, N.Y.

[21] Appl. No.: 488,314

[22] Filed: Jun. 7, 1995

[51] Int. Cl.⁶ ................................................. G06F 12/06
[52] U.S. Cl. ...................... 395/412; 395/497.01; 326/39
[58] Field of Search .......................... 395/412, 421.02, 395/421.1, 497.01; 364/970, 970.2, 970.4; 382/296; 326/39

[56] References Cited

U.S. PATENT DOCUMENTS

| | | | |
|---|---|---|---|
| 4,876,466 | 10/1989 | Kondou et al. | 326/38 |
| 4,893,281 | 1/1990 | Hashimoto | 365/230.06 |
| 5,067,167 | 11/1991 | Berger | 382/277 |
| 5,291,079 | 3/1994 | Goetting | 326/38 |
| 5,293,593 | 3/1994 | Hodge et al. | 395/412 |
| 5,298,805 | 3/1994 | Garverick et al. | 326/37 |
| 5,313,119 | 5/1994 | Cooke et al. | 326/41 |
| 5,477,494 | 12/1995 | Miyagawa et al. | 365/201 |

FOREIGN PATENT DOCUMENTS

| | | |
|---|---|---|
| 0496431A1 | 1/1992 | European Pat. Off. . |
| 6275074 | 9/1994 | Japan . |

OTHER PUBLICATIONS

T. A. Kean, PCT Patent Application WO 94/10754, filed Nov. 5, 1993, entitled "Improved Configurable Cellular Array".

Primary Examiner—Jack A. Lane
Assistant Examiner—Kevin Verbrugge
Attorney, Agent, or Firm—Heslin & Rothenberg, P.C.

[57] ABSTRACT

A field programmable gate array has a plurality of programmable resources addressable per respective x and y dimensions of an x,y two dimensional array. A memory device provides a plurality of memory units that store configuration data for configuring associated programmable resources of the field programmable gate array. A controller addresses the memory device with an N-bit address for retrieving given configuration data. An address decoder and sequencer divides the N-bit address into first, second, and third portions and employs the first and third portions interchangeably, in accordance with the second portion, for addressing respective x and y dimensions of the plurality of programmable resources for selecting an associated programmable resource to be configured in accordance with the retrieved configuration data.

18 Claims, 11 Drawing Sheets fig. 8

|  |  | BYTE | b or W | A15-0 | W or b |  |  |  |  | STATE |
|---|---|---|---|---|---|---|---|---|---|---|
| V | H | 15 14 | A13-8 | 7 | A6-0 |  |  | V | H |  |
| b0 |  | 0 0 | 000000 | 0 | 0000000 | START | C | W0 |  | SC0 |
| b55 |  | 0 0 | 110111 | 0 | 0110111 | END | C | W55 |  |  |
|  | *0 | 0 0 | 000000 | 1 | 0000000 | START | bcde |  | b0 | SC1 |
|  | *55 | 1 1 | 110111 | 1 | 0110111 | END | bcde |  | b55 |  |
| b0 |  | 0 0 | 000000 | 0 | 0111000 | START | J | W56 |  | SJ0 |
| b55 |  | 0 0 | 110111 | 0 | 0111110 | END | J | W62 |  |  |
|  | W0 | 0 0 | 000000 | 1 | 0111000 | START | J |  | b56 | SJ1 |
|  | W55 | 0 0 | 110111 | 1 | 0111110 | END | J |  | b62 |  |
| b0 |  | 0 1 | 000000 | 0 | 0111000 | START | D | W56 |  | SD |
| b55 |  | 0 1 | 110111 | 0 | 0111110 | END | D | W62 |  |  |
| b0 |  | 1 0 | 000000 | 0 | 0111011 | START | G | W59 |  | SG |
| b55 |  | 1 0 | 110111 | 0 | 0111011 | END | G | W59 |  |  |
|  |  |  |  |  | 0111111 | RESERVED |  |  |  | ERR1 |
|  | W59 | 1 0 | 111011 | 1 | 1000000 | START | Gextra |  | b64 | SGE |
|  | W59 | 1 0 | 111011 | 1 | 1000000 | END | Gextra |  | b64 |  |
| b0 |  | 0 0 | 000000 | 0 | 1000000 | START | fghl | W64 |  | SR0 |
| b55 |  | 1 1 | 110111 | 0 | 1001111 | END | fghl | W79 |  |  |
|  | W0 | 0 0 | 000000 | 1 | 1000000 | START | fghl |  | b64 | SR1 |
|  | W55 | 1 1 | 110111 | 1 | 1001111 | END | fghl |  | b79 |  |
| b0 |  | 0 0 | 000000 | 0 | 1010000 | START | nopq | W80 |  | SM0 |
| b55 |  | 1 1 | 110111 | 0 | 1010011 | END | nopq | W83 |  |  |
|  | W0 | 0 0 | 000000 | 1 | 1010000 | START | nopq |  | b80 | SM1 |
|  | W55 | 1 1 | 110111 | 1 | 1010011 | END | nopq |  | b83 |  |
| @66 |  | 0 0 | 000010 | 0 | 1010100 | START | stuv | @84 |  | SB0 |
| @77 |  | 1 1 | 001101 | 0 | 1010111 | END | wxyz | @87 |  |  |
|  | @66 | 0 0 | 000010 | 1 | 1010100 | START | stuv |  | @84 | SB1 |
|  | @77 | 1 1 | 001101 | 1 | 1010111 | END | wxyz |  | @87 |  |
| @84 |  | 0 0 | 010100 | 0 | 1010100 | START | stuv | @84 |  | SBC |
| @87 |  | 0 1 | 010111 | 0 | 1010111 | END | wxyz | @87 |  |  |
| b0 |  | 0 0 | 000000 | 0 | 1011000 | START | ii | W88 |  | SI0 |
| b55 |  | 0 0 | 110111 | 0 | 1011001 | END | ii | W89 |  |  |
|  | W0 | 0 0 | 000000 | 1 | 1011000 | START | ii |  | b88 | SI1 |
|  | W55 | 0 0 | 110111 | 1 | 1011001 | END | ii |  | b89 |  |
|  |  |  |  |  | 1011010 | START | RESERVED |  |  | ERR2 |
|  |  |  |  |  | 1111111 | END | RESERVED |  |  |  |
|  | W27 |  | 011011 | 1 | 1111111 | DIAGNOSTIC |  |  | b128 | DIAG | fig. 12

MEMORY MAPPING METHOD AND APPARATUS TO FOLD SPARSELY POPULATED STRUCTURES INTO DENSELY POPULATED MEMORY COLUMNS OR ROWS BY SELECTIVELY TRANSPOSING X AND Y ADDRESS PORTIONS, AND PROGRAMMABLE GATE ARRAY APPLICATIONS THEREOF

RELATED APPLICATION INFORMATION

This application relates to commonly owned concurrently or previously filed U.S. patent applications:

1. Ser. No. 08/459,579 now U.S. Pat. No. 5,631,578, entitled "PROGRAMMABLE ARRAY INTERCONNECT NETWORK";
2. Ser. No. 08/460,420, allowed, entitled "PROGRAMMABLE ARRAY I/O—ROUTING RESOURCE";
3. Ser. No. 08/459,156, allowed, entitled "PROGRAMMABLE ARRAY CLOCK/RESET RESOURCE"; and
4. Ser. No. 08/460,481, allowed, entitled "PROGRAMMABLE LOGIC CELL".

The section entitled "Description of the Preferred Embodiment(s)," and the drawings, from each of the above-referenced related U.S. patent applications are hereby expressly incorporated herein by reference.

TECHNICAL FIELD

This invention relates in general to integrated circuit devices, and, more specifically, to programmable integrated circuit devices having a plurality of programmable logic cells and a programmable interconnection network.

BACKGROUND OF THE INVENTION

Programmable integrated circuits are known in the art and include Programmable Logic Devices ("PLDs"), Programmable Array Logic ("PALs"), and Programmable Logic Arrays ("PLAs"). Each of these programmable circuits provides an input AND logic plane followed by an OR logic plane. An output function can thus be calculated which is the sum of the products of the input terms. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA"), wherein the configuration can be performed by a user, in the "field". Such configuration may be effected by using electrically programmable fusible links, antifuses, memory-controlled transistors, or floating-gate transistors.

To program the FPGA, configuration data is transferred from an external memory device to the electrically programmable resources of the FPGA. The electrically programmable resources of the FPGA generally are arranged in an array structure and are accessed per associated x and y addresses of the array. Typically, a memory map of the external memory corresponds to the memory map of the electrically programmable resources so that the address for accessing a memory cell of the external memory corresponds to the address for accessing its associated programmable resource. As the size and functionality of FPGA's increase, the associated memory map of the x,y addressable array becomes fragmented and non-contiguous. If the memory map of the external memory corresponds to that of the programmable resources, the external memory also becomes fragmented and non-contiguous resulting in many unused portions thereof requiring perhaps extra addressing bits than if otherwise allocated more tightly.

SUMMARY OF THE INVENTION

Accordingly, it is an object of the present invention to provide an improved method and apparatus for allocating memory to programmable resources of a programmable gate array.

It is a further object of the present invention to provide a method and apparatus for allocating external memory to a field programmable gate array that conserves memory space and reduces the number of address bits required for addressing the memory.

It is a further object of the present invention to provide a method and apparatus for allocating memory to a field programmable gate array that reduces the size of memory required, so as to reduce the number of address bits required for addressing the memory, while maintaining a correlation between addresses of the memory with respect to relative placement of associated programmable resources of the field programmable gate array.

In accordance with a first aspect of the present invention, a computing system has a plurality of addressable memory units and a plurality of controllable resources arranged in a two-dimensional array. Each of the plurality of controllable resources has an associated one of the plurality of memory units corresponding thereto. The plurality of memory units are accessed by an N-bit address. In associating the plurality of memory units to the respective controllable resources, the N-bit address for addressing the plurality of memory units is divided into first, second and third portions. The first and third portions are switchably associated with respective dimensions of the two-dimensional array. The second portion is used for determining which of the two dimensions the first and third portions are associated.

In accordance with another aspect of the present invention, a method is provided for allocating memory to a programmable gate array having a plurality of programmable resources addressable per an x,y two-dimensional array. The memory is addressed by an N-bit address. The N-bit address is divided into first, second and third portions. The first and third portions of the N-bit address are switchably associated to respective x and y dimensions of the x,y two-dimensional array of the plurality of programmable resources in accordance with the second portion. Memory units as addressed by the N-bit address are allocated to respective programmable resources of the plurality of programmable resources within the x,y two-dimensional array as addressed by the first and third portions of the N-bit address.

Further to the above aspect of the present invention, a programmable resource at a given location of the x,y two-dimensional array has a plurality of individual programmable resources addressable along a third z dimension. The step of dividing the N-bit address further comprises providing a fourth portion of the N-bit address which is associated with the third z-dimension. Memory as addressed by the N-bit address is allocated to respective individual programmable resources of the plurality of individual programmable resources along the third z-dimension as addressed by the fourth portion and within the x,y two-dimensional array as addressed by the first and third portions of the N-bit address in accordance with the second portion.

In accordance with another embodiment of the present invention, a computing system comprises a plurality of programmable resources addressable per an x,y two-dimensional array and a plurality of addressable memory units addressable per an N-bit address. A controller addresses the plurality of addressable memory units per a given N-bit address. A divider divides the N-bit address into first, second and third portions. A decoder switchably addresses respective x and y dimensions of the x,y two-dimensional array with the first and third, or the third and first portions respectively of said given N-bit address in accordance with the second portion thereof.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

FIG. 8 provides a physical mapping of various programmable resources associated with sectors 1, 2, 3 and 4 of those depicted in FIG. 7;

FIG. 12 is a table outlining various states of a state machine and associated addresses generated thereby.

DESCRIPTION OF THE PREFERRED EMBODIMENT(S)

The present invention provides a method and apparatus, for efficient allocation of memory to programmable resources of a programmable gate array. The method and apparatus reduce the number of address bits required for addressing the memory while preserving correlation between addresses for addressing the memory and relative placement of the associated programmable resources of the programmable gate array. For enabling an understanding of the present invention, the disclosure herein employs the invention in the context of a field programmable gate array which has various programmable resources arranged relative to the each other across an array. This portrayal of the present invention for mapping configuration data, as associated with configuring the programmable resources of a field programmable gate array, is to provide an illustrative example application only. It should be understood that the address folding technique and apparatus, as introduced by the present invention, can also be employed in other comparable programmable array applications.

Hereafter, the disclosure briefly characterizes a field programmable gate array and its associated programmable resources. In characterizing the various programmable resources, symbols are introduced, representative of configuration data as required for configuring the various programmable resources. The symbols are then illustrated in a symbolic array diagram for characterizing relative placement of associated programmable resources within the field programmable gate array. Thereafter, a prior art data (configuration) memory map is introduced for allocating memory to the various programmable resources of the field programmable gate array, wherein the addresses for the configuration data of the memory map correspond to the relative placements of the associated programmable resources within the field programmable gate array. Finally, the address folding of the present invention is introduced. The address folding provides a more densely populated memory map that requires fewer address bits for addressing the memory, while preserving correspondence, albeit encoded, between the addresses and the relative placement of the associated programmable resources within the field programmable gate array.

Figure 1:
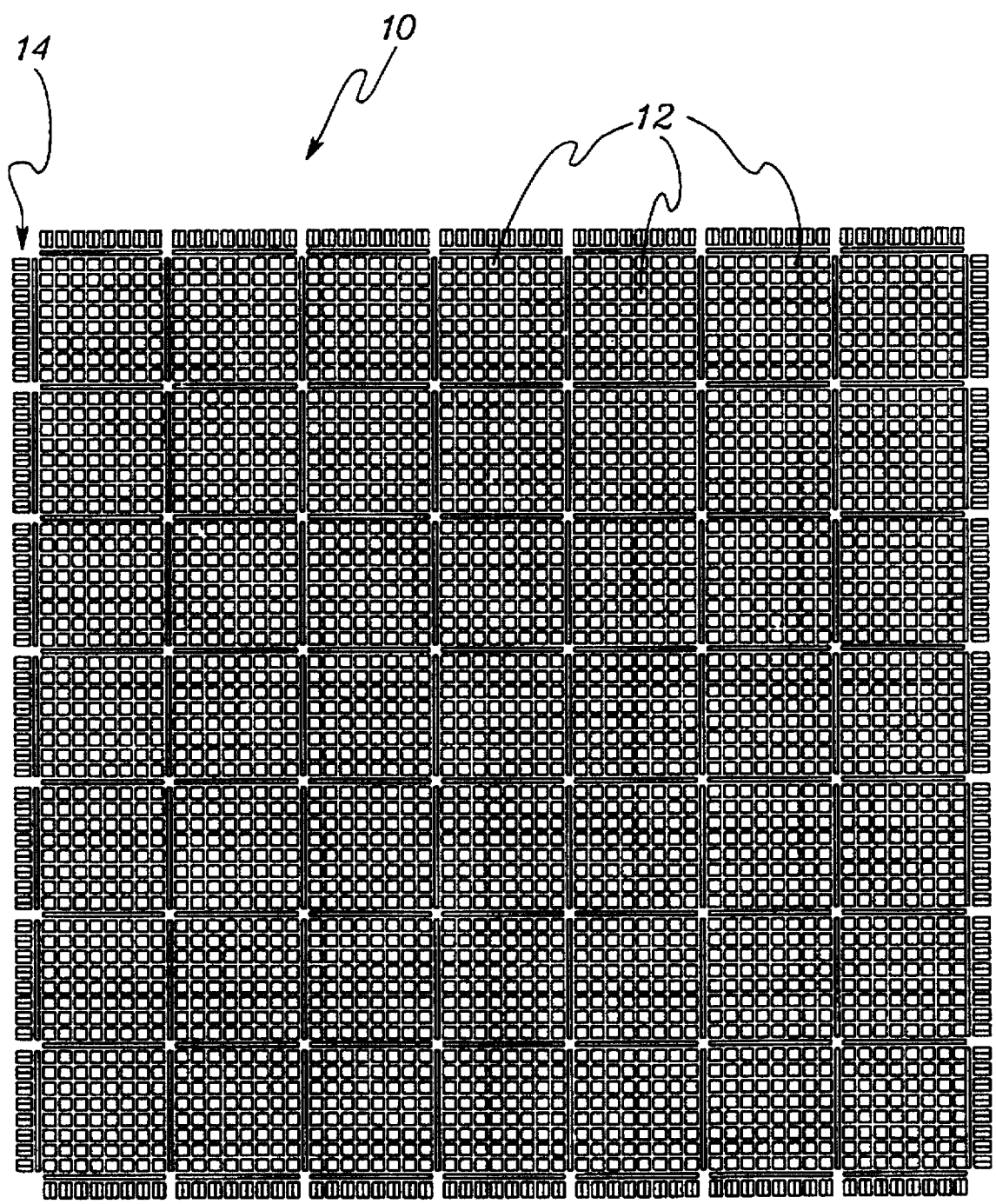
FIG. 1 illustrates a programmable gate array having a plurality of programmable logic cells arranged therein.

With reference to FIG. 1, there is shown a layout of a programmable gate array 10 comprising a plurality of logic cells. In this particular embodiment, the plurality of programmable logic cells comprises a 56×56 array of cells divided into sectors 12. Each sector 12 is defined by an 8×8 group of cells. Also depicted are input/output pins 14 along the perimeter of the array which may be used for data input and output. In addition, certain pins may be dedicated for use as clock pins, reset pins, or for configuration pins for programming the programmable resources of the array 10. The input/output portion of the array can be implemented according to the above-incorporated portions of the U.S. patent application entitled "PROGRAMMABLE ARRAY I/O—ROUTING RESOURCE."

Figure 2:
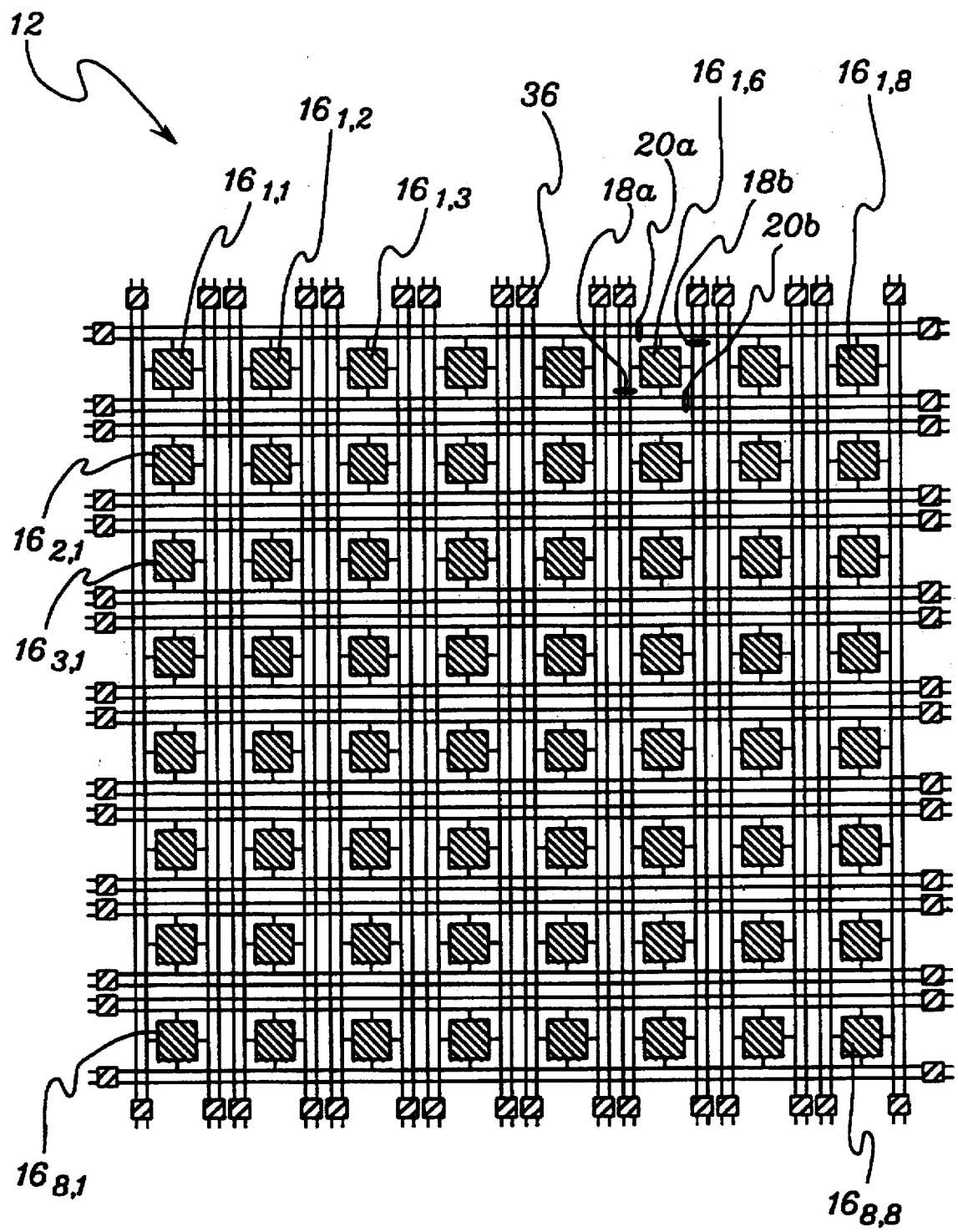
FIG. 2 depicts a sector portion of a programmable gate array having a plurality of programmable logic cells arranged therein, and a programmable interconnect network for selectively connecting the logic cells.

With reference to FIG. 2, there is shown a single sector 12 of programmable logic cells comprising logic cells $16_{1,1}$ to $16_{8,8}$. Logic cell $16_{1,6}$, is shown surrounded by vertical interconnect conductors 18a and 18b, and horizontal interconnect conductors 20a and 20b. These horizontal and vertical interconnect conductors are positioned between the rows and columns of the array and provide connections between any two logic cells in the array and the input/output pins. The interconnect conductors together-form the overall interconnect network of the programmable array. Programmable resources within the interconnect network may be provided in addition to those in programmable logic cells. The programmable resources in the interconnect network may include, for example, switching elements 36 which allow signals to be transmitted between two vertical conductors. In addition, bus turns (not shown) may be employed to provide programmable interconnections between a specified vertical and a specified horizontal interconnect conductor. The interconnect network can be implemented according to the above-incorporated portions of the U.S. patent application entitled "PROGRAMMABLE ARRAY INTERCONNECT NETWORK."

Figure 3:
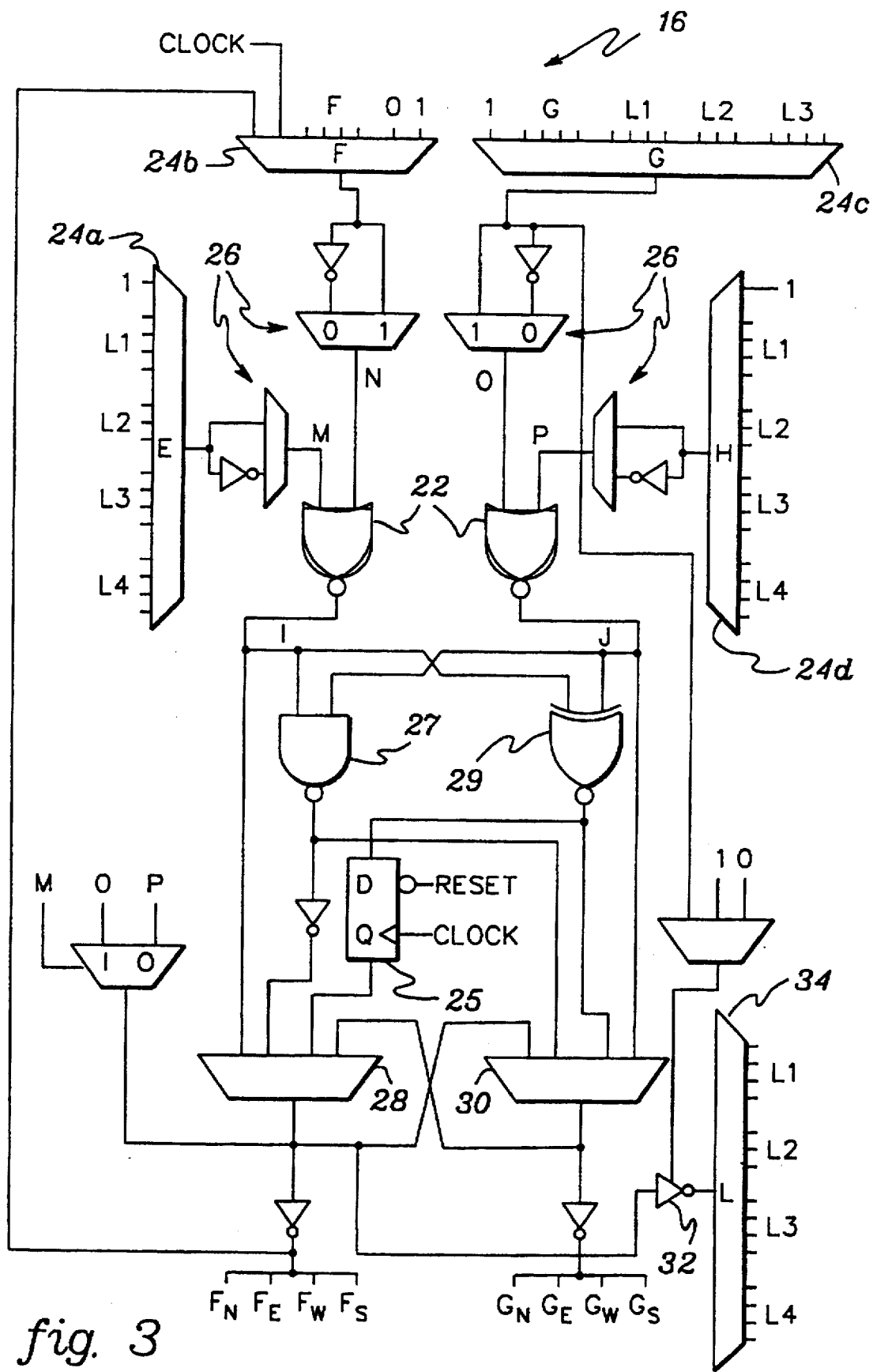
FIG. 3 is a block diagram illustrating programmable logic devices and interconnects of a logic cell.

Each logic cell 16 as related to a particular programmable gate array, with reference to FIG. 3, comprises a plurality of logic devices and internal interconnects. Programmable input multiplexers 24a–24d, receive a plurality of inputs from respective local buses L1,L2,L3,L4 surrounding the logic cell. In addition, some of the inputs to the multiplexers are direct connections F,G to neighboring logic cells along with clock, feedback and logic 1 or 0 signals.

Each input multiplexer 24 has select lines (not shown) driven by programmable bits of a static RAM (not shown) for selecting which inputs to couple to the internal logic of the logic cell 16. Programmable input multiplexer 24a has 16 inputs and accordingly requires 4 programmable bits for selecting which one of the 16 inputs to pass forward to its output E. Programmable input multiplexer 24b has 8 bits and therefore requires only 3 programming bits for configuring the multiplexer to select one of the 8 inputs to pass forward to its output F. Programmable input multiplexer 24c has 16 inputs along with multiplexer 24d, accordingly, each multiplexer requires 4 configuration bits.

The output from each multiplexer 24 is passed through programmable inverters 26 which pass the output from respective multiplexers to respective programmable NAND/NOR logic devices 22, either directly or inverted in accordance with the programming state of the programmable inverter. The type of logic of the programmable NAND/NOR gates 22 is determined in accordance with their associated programmable bit. The outputs I,J from logic devices 22 are coupled to additional logic devices 27,29 and multiplexers 28,30. Flip/flop 25 receives a D input signal from logic device 29 and associated reset and clock signals.

Output multiplexer 28 has four inputs: one from output I of logic device 22, one from logic device 27 via an inverter, one from flip/flop 25, and another from the output of multiplexer 30. Multiplexer 28 is configured in accordance with its configuration bits (not shown) and has an output coupled to the programmable output multiplexer 34 via tri-state buffer 32. In addition, the output of multiplexer 28 provides the direct connections F to neighboring logic cells at the north, east, west, and south sides. Multiplexer 30 has four inputs one from output J of logic device 22, two others from logic devices 29 and 27, and another from the output of multiplexer 28. The output of multiplexer 30 provides the direct connections G to the neighboring logic cells via an inverting buffer.

Output multiplexer 34 has 16 outputs coupled to associated local buses L1–L4 at the various sides of the logic cell. The output from tri-state buffer 32 is coupled to one of the 16 outputs in accordance with the multiplexer's configuration bits (not shown). Further description of the internal logic and interconnects of logic cell 16 can be obtained according to the above incorporated portions of U.S. Patent Application entitled "PROGRAMMABLE LOGIC CELL".

Pass gate multiplexers are employed as the input and output multiplexers for providing the core cell interconnects to the local buses. The multiplexers are controlled by static random access memory (SRAM) cells. The SRAM cells are directly or indirectly (through decoders) tied to gates of pass gates within the pass gate multiplexers thus controlling the states of the pass gates. For example, logic cell 16 comprises a programmable input multiplexer 24a which controls the E input connections at the various sides of the logic cell. In this particular embodiment, a single connection is routed from each potential bus into the source/drain combination of a transmission gate, and the drain/source combination of the transmission gate is routed to the input node of the logic cell. Sixteen such transmission gates may be found in a 16:1 pass gate multiplexer. Software and decoding logic of the programming system ensures that only one particular pass gate is propagating a signal to the input node associated with multiplexer 24a.

In the following sections, lables and symbols are introduced for representing configuration data of various programmable resources of a programmable gate array. Only a general description of the configuration data, associated programmable resources and relative relationships thereof is provided. Specific details of such data and programmable resources is not required for understanding the present invention, which is concerned primarily with a memory map for allocating memory (for holding configuration data) to programmable resources of a programmable array. The following table provides a quick reference of the configuration data symbols, corresponding byte labels, associated description and number of bits per column with reference to a field programmable gate array.

| Symbol | Bytes | Description | Bits/Column |
|---|---|---|---|
| C | a | Cell Logic | 8 |
| W | bcde | Cell Wiring | 32 |
| R | fgh fgh | Repeater Groups | 48 |
| L | ll | Repeater Latch Jumpers | 16 |
| J |  | Jumpers | 4 |
| D |  | Clock/Reset Distribution | 4 |
| G |  | Global Distribution | 5 |
| I | ii | I/O Configuration | 8 |
| B | stuv wxyz | I/O Bus Repeaters | 64 |
| M | nopq | I/O BusTurns & MUX | 32 |

The programmable NAND/NOR logic devices 22 of logic cell 16 can be configured and programmed by 8 bits. These 8 bits of configuration data will be labeled byte "a" and be represented by symbol C. Each logic cell 16 of the field programmable gate array requires associated configuration cell logic data C.

Four additional bytes of data "bcde" are required for configuring the core cell wiring network. These 4 bytes of data will be represented collectively by W. Therefore, it will be understood that 32 wiring configuration bits and 8 logic configuration bits are required for programming each logic cell of the field programmable gate array.

Figure 4:
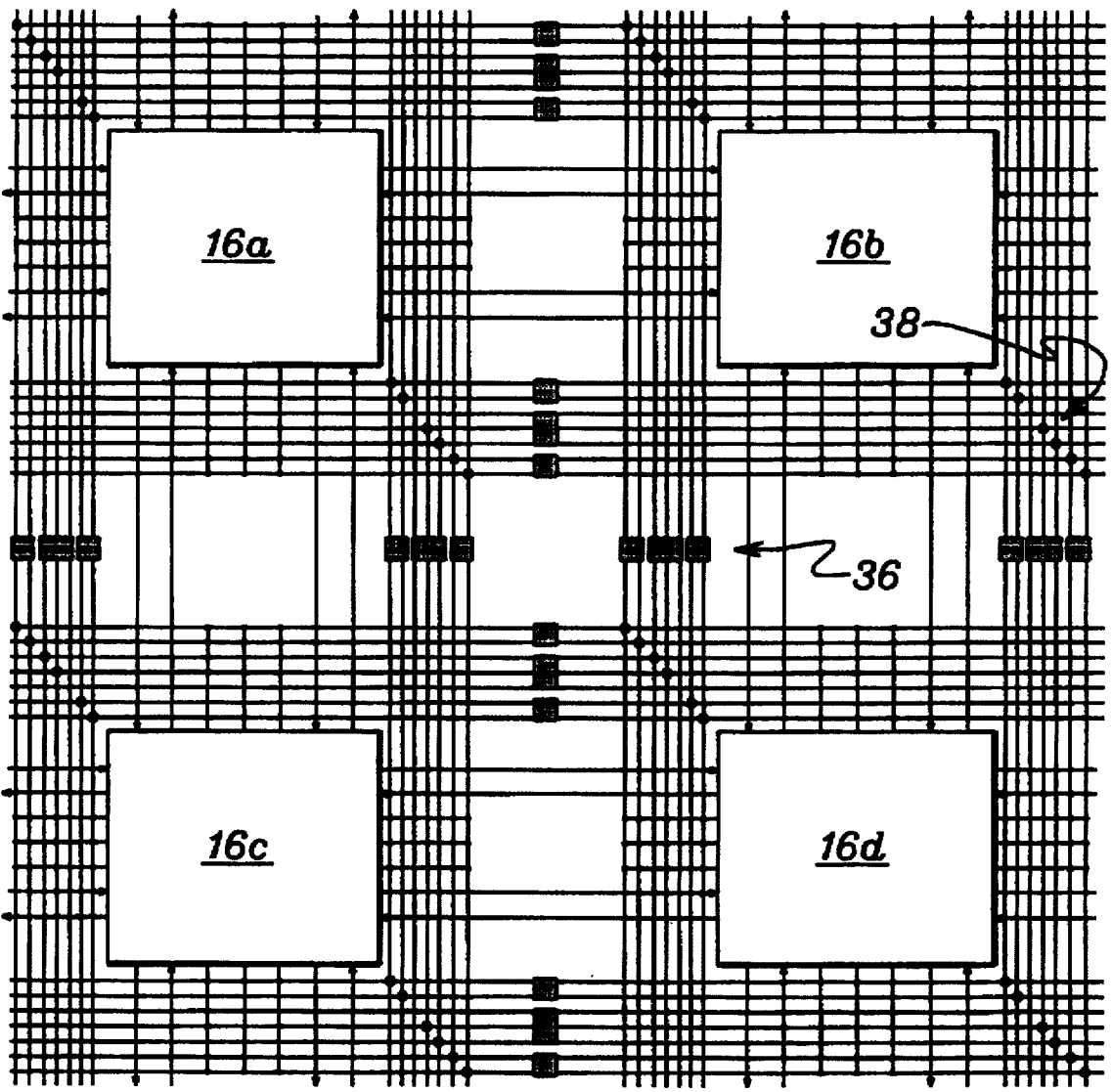
FIG. 4 illustrates four core cells and their associated bussing at the boundary of four separate sectors.

As shown in FIG. 4, programmable bus turns 38 are provided at two of the diagonally disposed corners of each core cell and are capable of coupling vertical buses to horizontal buses for all buses except the super bus. The configuration data for configuring the programmable bus turns between bus lines surrounding core cell 16 is included in the wiring configuration data W for the given core cell.

Figure 6:
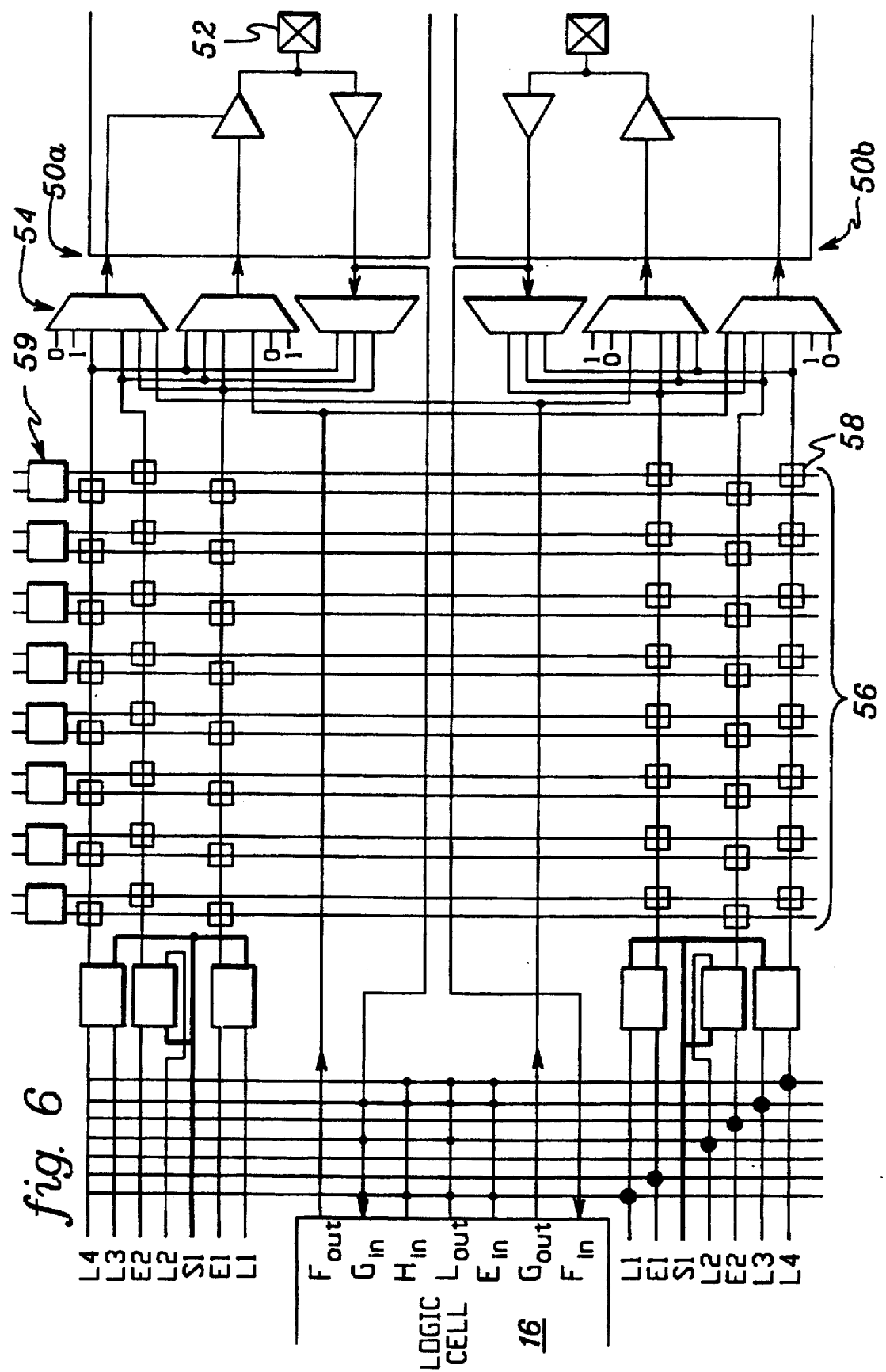
FIG. 6 is a block diagram illustrating input/output programmable resources of the programmable gate array.

With reference to FIG. 4, and the logic cell portion of FIG. 6 horizontal and vertical buses surround each of logic cells 16 within the field programmable gate array. The buses comprise four local buses L1,L2,L3,L4, two express buses E1, M2 and one super bus S1. At the boundary of each sector, e.g. every 8 logic cells, repeater groups 36 are interposed in the bus lines for providing switching between the local, express and super bus lines and for buffering the local buses across the various sectors of the field programmable gate array. Each repeater of a repeater group is programmable by associated configuration data to provide one of a plurality of interconnect configurations. Eight programming bits are required for configuring each of the 6 repeaters in a repeater group. The associated bytes of data for configuring a repeater group will be labeled "fgh fgh". The configuration data for these 6 bytes will be represented collectively by the symbol R.

Repeater latch jumpers (not shown) are also associated with each repeater of the respective repeater groups 36. Associated with the local bus of each repeater groups is a programmable pass gate (jumper) which can be selectively enabled for coupling the local bus of one side of the repeater group to the associated local bus of the other side of the repeater group. In addition, an LSSD (Level Sensitive Scan Design) latch is disposed between the local bus of the one side of the repeater group and the associated local bus of the other side of the repeater group. The LSSD register (latch) is programmable for selectively capturing data of the local bus, selectively propagating a signal therethrough, or selectively presenting a signal thereof onto the local bus. It is noted that 8 configuration bits are required per latch jumper trio and that two trio's are provided per repeater group. Therefore, two bytes "ll" of configuration data are required for a given latch jumper group. These two bytes of configuration data will be known collectively as L.

Half way across a given sector, select local buses, as associated with both rows and columns, are equipped with horizontal jumpers for associated row buses and vertical jumpers for associated column buses. The horizontal and vertical jumpers further divide respective buses into smaller bus segments, so that one segment of a local bus across a given sector may or may not be isolated from another segment of the local bus. Four bits of configuration data are required for programming the horizontal jumpers of the horizontal buses per row of logic cells per sector, and 4 bits of configuration data are required for programming the vertical jumpers of the vertical buses per column of logic cells per sector. The four bits of configuration data required for configuring each jumper group individually will be known collectively as J.

Figures 5A, 5B:
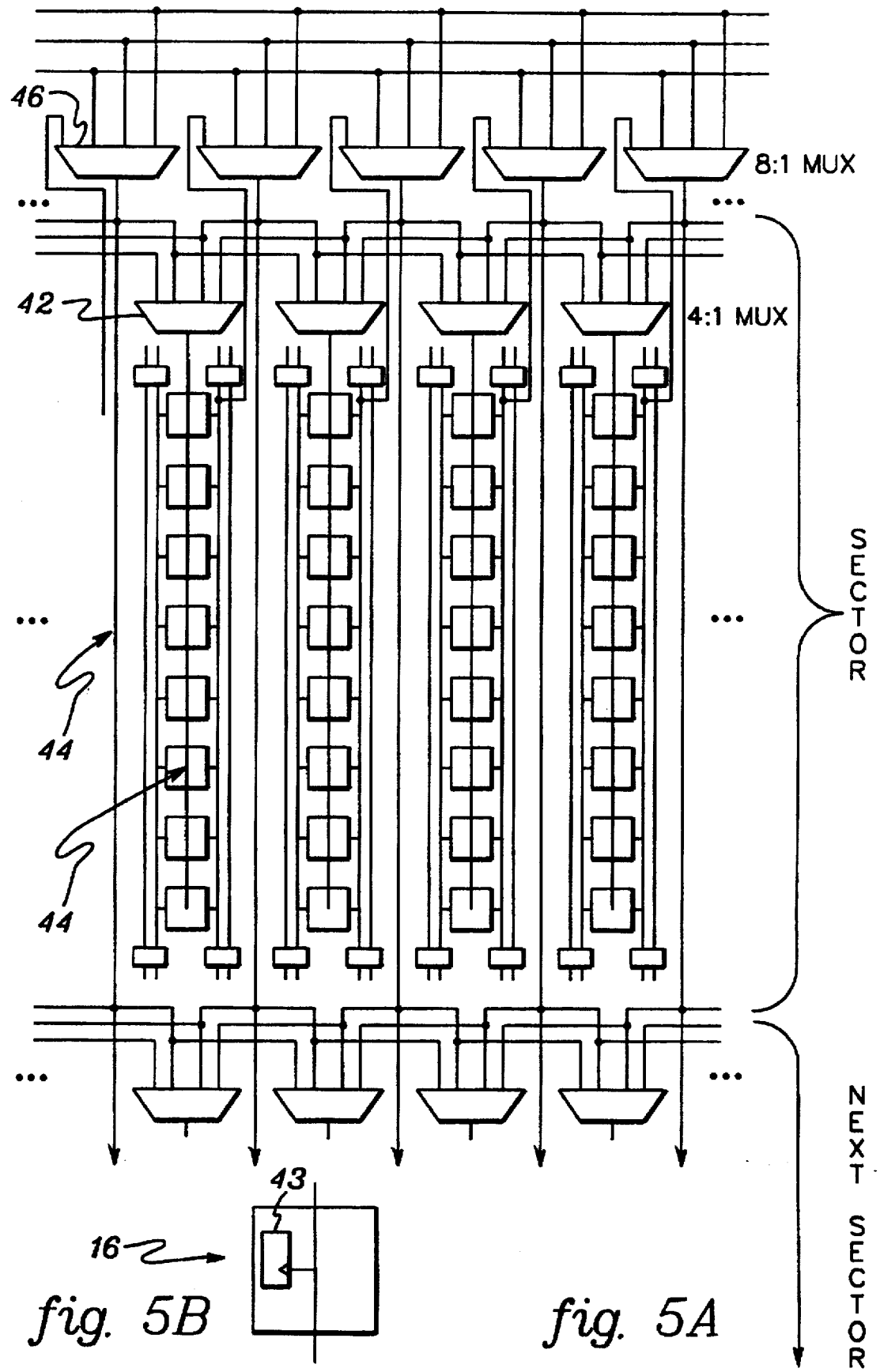
FIG. 5A is a block diagram illustrating programmable clock resources of the programmable gate array.
FIG. 5B illustrates a single logic cell of FIG. 5A.

With reference to FIG. 5A and 5B, each column of each sector has a distribution network for distributing clock signals to the flip/flops 43 of the logic cells 16, and a similar distribution network for distributing reset signals thereto. Column clock line 44 receives a clock signal from the output of an associated column clock multiplexer 42 and couples this clock signal to the flip/flops 43 of each logic cell 16 in a column of logic cells in a sector. Multiplexer 42 is configured per 2 bits of configuration data, for driving column clock line 44 with a clock signal as selected, in accordance with the 2 bits of configuration data, from one of four adjacent global clock lines, e.g. 44. Likewise, similar circuitry and signal lines (not shown) are provided for distributing reset signals to the flip/flops 43 of the various core cell columns. Two bits of configuration data are similarly required for configuring the associated reset multiplexer of each column. Thus, a total of 4 bits of configuration data are required per column for configuring multiplexers for distributing respective clock and reset signals within a given sector. These 4 bits of distribution configuration data will be represented collectively by the symbol D.

Associated with each column of the field programmable gate array, as being characterized in a particular embodiment thereof, spanning multiple sectors are global column clock lines 44 which distribute clock signals from associated global column multiplexers 46. Three primary clocks are available as inputs to each of the global multiplexers 46 for driving the respective global column clock lines 44. Alternatively, six primary clocks are made available to an 8 input multiplexer (not shown). An additional signal line from a given column of a given sector is coupled as a fourth (seventh) input to multiplexer 46 available for driving the associated global column clock line 44. Similar global column lines and multiplexer networks (not shown) are provided for distributing reset signals along the columns of the field programmable gate array. Five bits of configuration data are required per column for programming the multiplexers for distributing the global clock and reset signals. Three bits of data are required for configuring the global column clock multiplexer and 2 bits of data are required for configuring a similar global column reset multiplexer. These 5 bits of global configuration data will be labeled collectively as G. Further information regarding the configuration and programming of the clock and reset networks within the field programmable gate array can be obtained from the above-incorporated portions of the U.S. patent application entitled "PROGRAMMABLE ARRAY CLOCK/RESET RESOURCE."

At the ends of each column and row of logic cells within the field programmable gate array are input/output networks 50a and 50b as shown with reference to FIG. 6. Input/Output (I/O) pad 52 is coupled to the input of a receiver buffer and the output of an output buffer. Four bits of data are required for each I/O to program its configuration. Accordingly, 8 bits of configuration data are required for programming the configuration of both I/O networks 50a and 50b. Each 4 bit byte of data for programming each I/O network will be labeled "i". The combined 8 bits of configuration data for programming the pair of I/O networks 50a and 50b will be represented collectively by symbol I.

Multiplexers 54 determine which signal to use for enabling the tri-state buffer, which lines to couple input data to, or from which lines to send out output data. An I/O bus 56 runs along the perimeter of the field programmable gate array (integrated between the perimeter logic cells and the I/O blocks) for routing I/O lines to various rows and columns of the field programmable gate array. I/O bus turns 58 are programmable for selectively coupling given I/O lines to I/O bus 56. Four bytes of configuration data "nopq" are required for programming the I/O bus turns 58 and multiplexers 54. These 4 bytes of configuration data will be represented collectively by the symbol M.

Along the I/O bus 56 surrounding the perimeter of the field programmable gate array are I/O bus repeaters 59 which buffer the I/O signals along the I/O bus. The I/O bus repeater groups 58 are provided along the I/O bus between each sector boundary and each corner of the FPGA. Eight bytes of configuration data "stuv wxyz" are required for programming each I/O bus repeater group 59. This configuration data for configuring an I/O bus repeater group will be represented collectively by the symbol B. Further information regarding the I/O resources for the FPGA can be obtained from the above-incorporated portions of the U.S. patent application entitled "PROGRAMMABLE ARRAY I/O ROUTING RESOURCE."

Having identified various programmable resources and associated configuration data of a programmable gate array, the relative placement of these programmable resources is next characterized for lending further significance to particular features of the present invention, which will be described thereafter.

Figure 7:
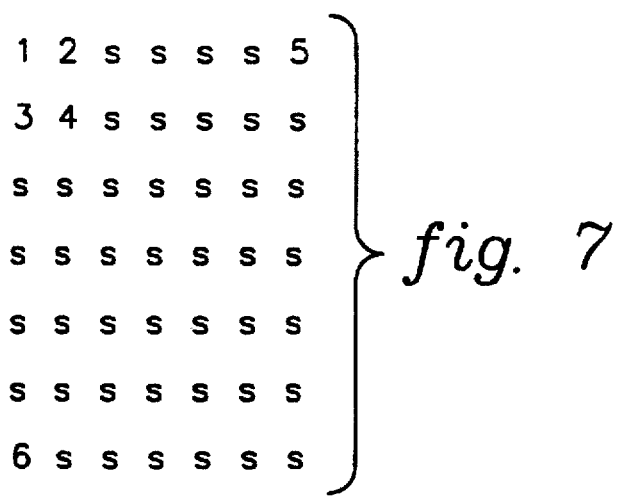
FIG. 7 depicts various sectors of a 7×7 array of sectors.
Figure 8:
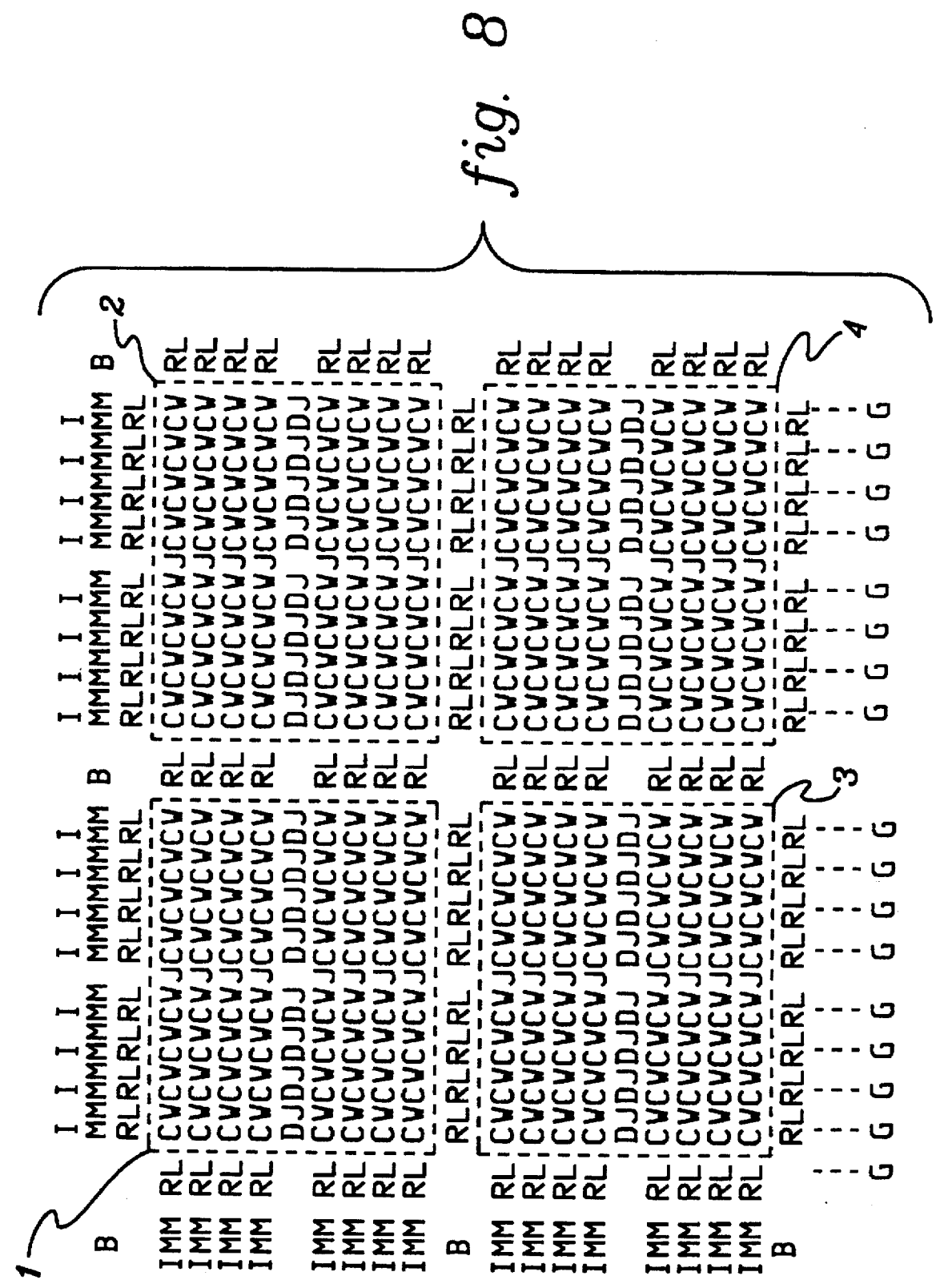

FIG. 7 represents a 7×7 array of sectors of a programmable gate array wherein select sectors are labeled with reference numerals. FIG. 8 depicts a physical bit mapping of the programmable resources within four adjacent sectors 1,2,3,4 of the upper left corner of the field programmable gate array as represented by FIG.7. Along the top and left sides of the programmable resources, at each column head and row end are I/O programmable resources that receive configuration data I for configuring each pair of I/O networks. I/O bus turns and multiplexer configuration data M is associated proximate each input/output network for determining the interconnects of each associated I/O port. Each sector includes an 8×8 array of core cell logic and core cell wiring programmable resources, each being configured by configuration data C and W respectively. Between sectors, each of the column and row buses have associated bus repeater groups and repeater latch jumpers that are configured by respective configuration data R and L. Half way across each row and half way down each column of each sector are vertical and horizontal jumpers for select local buses configured by associated configuration data J. In addition, half way down the length of each column of each sector are associated clock and reset distribution programmable resources configured by configuration data D. Along the perimeter of the programmable gate array at each sector boundary are the I/O bus repeater programmable resources configured by configuration data B. I/O bus repeaters are also located at the four separate corners of the field programmable gate array. Finally, half way down each column of the field programmable gate array are the global clock/reset distribution resources which are configured by configuration data G for distributing respective clock and reset signals along the associated columns.

Various technologies are known to those skilled in the art to provide array programmability. Mask programming techniques include customizing the deposition of the final layers of the metallization of an otherwise generally designed integrated circuit (see, for example U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTERSLICE CELL," May 3, 1988; both patents assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, Feb. 1985, at pg. 399). Fusible links or antifuses can be employed and offer permanent (non-volatile) programming (see, for example, Millman, "MICROELECTRONICS," Mc-Graw-Hill, Inc., 1979, at pg. 196; and U.S. Pat. No. 4,758,745 to Elgamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURNAROUND TIME VLSI DEVELOPMENT HARDWARE," IEEE Journal of Solid-State Circuits, Vol. SC-16, No. 5, Oct. 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

As discussed above, the preferred approach for programming the logic cell of the present invention involves SRAM memory cells, programmed by a user. The array can be configured in accordance with the techniques disclosed in the publication entitled "APPLICATION NOTE AT6000 SERIES CONFIGURATION", May 1993, Revision 1B, Atmel Corporation, which is hereby incorporated by reference in its entirety. The memory cells of the SRAM are allocated to the resources of the FPGA in accordance with the logic bit map of FIG. 9.

The following portion of this disclosure describes allocation of memory, for holding configuration data, to associated programmable resources of a programmable gate array.

Figure 9:
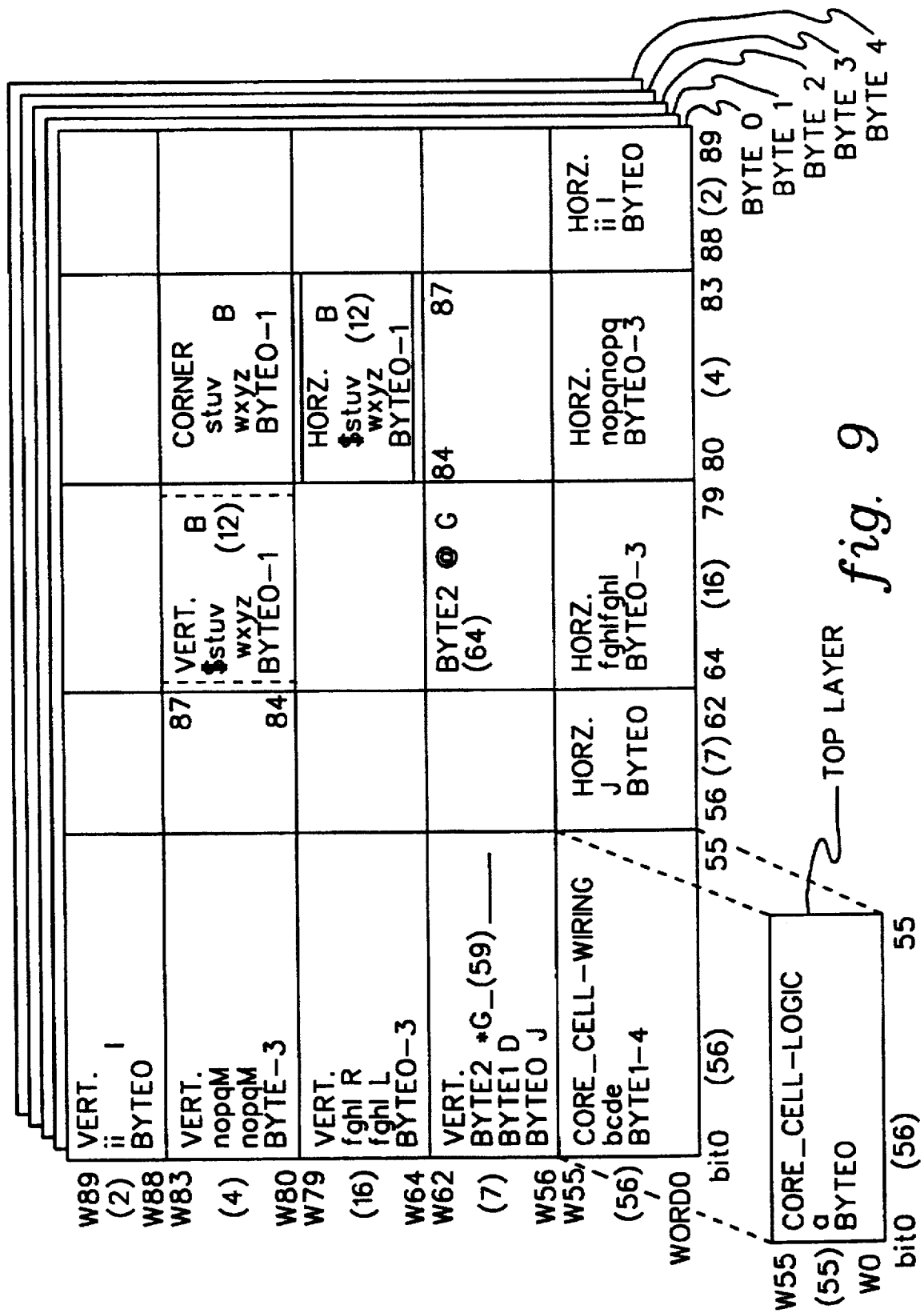
FIG. 9 provides a logical bit map for programming the various resources of a programmable gate array.

The logical bit map of FIG. 9 represents a three dimensional memory map assigning memory cells of an SRAM to the resources of the field programmable gate array. The memory map of FIG. 9 is structured in accordance with a known procedure for allocating memory to programmable resources of a programmable gate array. The horizonal x axis of the SRAM memory map is addressable from bit 0 through bit 89. The vertical y axis of the SRAM memory map is addressable from word 0 through word 89. The third z axis of the SRAM memory map is addressable from byte 0 through byte 4, as is illustrated by the separate layered planes.

In the memory block of bit 0 through bit 55, word 0 through word 55, and byte 0 (which top layer with reference to FIG. 9 has been offset from the overall memory map), the associated SRAM memory cells provide configuration data C for programming the logic of the respective logic cells of the field programmable gate array. As provided hereinbefore, configuration data C comprises data byte "a". Note that data byte $a_{0,0}$ (not shown individually), is stored in this memory block at bit 0, word 0, and provides the configuration data for programming the logic of logic cell $16_{1,1}$ (FIG. 2) of the field programmable gate array. Likewise, data byte $a_{55,55}$ (not shown individually), is stored in this memory block at bit 55, word 55, and provides the configuration data for configuring logic cell $16_{56,56}$ (not shown) of the field programmable gate array.

As described hereinbefore, the wiring resources for each logic cell of the field programmable gate array required four bytes of data, "bcde", (configuration data W). Note that the four separate data bytes, "bcde", are addressable in the SRAM memory map along the z axis, byte 1 through byte 4, for each x,y location. To program wiring resources of the logic cell of the first column and first row of the field programmable gate array, the SRAM at the bit 0, word 0 location is loaded with configuration data, "bcde", into respective z bytes 1–4. Likewise, to program the programmable wiring resources of the logic cell of the 56th column and 56th row, the SRAM is loaded with respective configuration data, "bcde", into the respective z bytes 1–4 at the bit 55, word 55 location.

Moving along the x axis, the SRAM memory cells of the block from x address locations bit 56 through bit 62 and y axis locations word 0 through word 55 provide the horizontal jumper configuration data J for driving the respective programmable jumper resources of the field programmable gate array along the respective 56 horizontal rows of the field programmable gate array. Note that 7 locations are provided from bit 56 to bit 62 in accordance with the 7 jumpers per row of the field programmable gate array (refer to FIG. 8).

The memory block from bit 64 to bit 79, and from word 0 to word 55, of the SRAM memory map, provides configuration data R and L for configuring the bus repeaters and latches respectively for each row of the field programmable gate array. The configuration data allocated in this particular block of memory include the repeater ("fgh") and latch ("1") configuration data bytes respectively. The respective "fgh" data bytes are allocated along z axis bytes 0–2 of the SRAM while the "1" data byte is allocated along the z axis at byte 3. Note that 6 bytes of configuration data are required per repeater group and 2 bytes of configuration data are required per jumper group. With 8 groups of repeaters and jumpers provided per row, 16 locations are provided along the x axis (from bit 64 to bit 79) for each row of the 56 rows of the field programmable gate array.

The memory map from bits 80–83, and word 0–55, provides configuration data M for configuring the I/O bus turns and multiplexers at the end of each row of logic cells. Data bytes "nopq" are allocated, at each x,y memory location, along the z axis into respective bytes 0–3. Note that 2 sets of I/O bus turn the multiplexer configuration data (MM) are required at each end of each row of the field programmable gate array. Therefore, four locations are provided along the x axis from bit 80 to bit 83 for the corresponding I/O bus turn and multiplexer programmable resources of each row of the 56 rows of the field programmable gate array, two bit locations per row end.

The configuration data I for configuring the I/O configurations of the input/output ports at the row ends of the field programmable gate array are allocated in the SRAM memory map in the block from bits 88–89 and word 0–55, with only one byte of data being provided along the z axis byte 0, at each x,y location. Given that there are two, one-byte, I/O programmable resources for each row (one per row end) of the field programmable gate array, only two locations are designated along the x axis from bit 88 to bit 89. Having identified the "horizontal" programmable resources supporting the rows of logic cells of the field programmable gate array and the associated configuration data in the SRAM memory map, attention is now directed to the "vertical" programmable resources supporting the columns of logic cells of the field programmable gate array and the associated configuration data in the SRAM memory map.

The memory block from bit 0–55, word 56–62, and byte 0–2, provides the configuration data J, D and G configuring the jumpers, local distribution and global distribution programmable resources respectively for each column of the field programmable gate array. Seven jumpers and seven clock/reset distribution resources are provided in each column of the field programmable gate array. The jumper configuration data J is provided in byte 0, while the distribution configuration data D is provided in byte 1 at each associated x,y location. In contrast, only one global clock/reset distribution resource is provided per column of the field programmable gate array. The global distribution configuration data G is provided at byte 2, word 59, for each column of the 56 columns. Because there is one additional global distribution programmable resource than number of columns of the field programmable gate array, an additional SRAM memory cell is located at bit 64, word 59, byte 2, for providing the configuration data @G for programming the one additional global distribution programmable resource.

The configuration data R and L for configuring the bus repeaters and latches for each column of the field programmable gate array are provided in the memory block spanning bits 0–55 and words 64–79. The associated "fghl" configuration data bytes are allocated in the respective z axis locations bytes 0–3.

The configuration data MM for configuring the I/O bus turns and multiplexers at the ends of each column of the field programmable gate array is allocated in the SRAM memory map spanning bits 0–55 and words 80–83. The respective data bytes "nopq" are allocated along the z axis bytes 0–3 respectively at each associated x,y location.

Finally, the configuration data I for configuring the I/O personality programmable resources at the ends of each column of the field programmable gate array is allocated in the SRAM memory map spanning bits 0–55 and words 88–89.

The I/O bus repeater programmable resources distributed about the perimeter of the field programmable gate array require 8 bytes, "stuv wxyz", of configuration data per repeater group. The horizontal, or alternatively west/east, I/O bus repeater programmable resources, are configured in accordance with the configuration data located in the SRAM memory block bits 84–87 spanning 12 associated word lines. There are 8 I/O bus repeaters required between each of the sectors at a given edge of the field programmable gate array. Each I/O bus repeater requires one byte of configuration data. Accordingly, each I/O repeater group (8 I/O bus repeaters) requires 8 bytes of configuration data "stuv wxyz". The associated configuration-data bytes "stuv" and "wxyz" are allocated in z axis byte locations 0–1 at four respective adjacent x,y locations of the SRAM memory map. For example, the two data bytes "st" are allocated in the z axis bytes 0–1 locations at the bit 84 and word 64 location of the SRAM. The two data bytes "uv" are allocated in the z axis bytes 0–1 locations at the bit 85 and word 64 location. The subsequent "wx" configuration data bytes are allocated in z axis bytes 0–1 memory locations at the bit 84 and word 65 memory map location while the subsequent "yz" configuration data bytes are allocated in the z axis 0–1 locations at the bit 85 and word 65 memory map location. Accordingly, it is seen that four address allocations (bit 84–85 and word 64–65) along the x axis and the y axis are required for each "horizontal" I/O bus repeater group. Thus, 12 word locations are required along the y axis for the associated 6 I/O bus repeater groups along a given edge of the field programmable gate array. Two locations along the xaxis (bit 84–85) per repeater group provide configuration data for one side of the field programmable gate array while the next two allocations along the x-axis (bit 86 and bit 87) provide corresponding configuration data for the repeater groups of the other side of the field programmable gate array.

The configuration data B for vertical, or alternatively north/south, I/O bus repeater resources is stored in the SRAM memory block from word 84 through word 87 and bit 64 through bit 75. The respective date bytes, "stuv wxyz", per I/O bus repeater group are allocated in z axis bytes 0–1 of respective neighboring x,y locations. The 12 memory allocations along the x axis and 4 associated memory locations along the y axis can be explained similarly to the memory block for the horizontal I/O bus repeater groups.

The configuration data B for the corner I/O bus repeater groups is allocated in the SRAM memory block designated by bits 84–87, words 84–87 and z axis bytes 0–1.

The SRAM memory map of FIG. 9 has 90 locations along an x-axis (bit 0 through bit 89), 90 locations along a y-axis (w0 through w89), and 5 locations along a z-axis (byte 0 through byte 4). Linearly addressing such a three-dimensional memory map, as allocated in accordance with the known procedure, would require 7 address bits for addressing the x-axis, 7 address bits for addressing the y-axis, and 3 address bits for addressing the z-axis,requiring a total of 17 address bits. Note that the linear memory map for the SRAM, as shown in FIG. 9, is fragmented and has many empty locations.

When a field programmable gate array (FPGA) is incorporated within a computing system, the SRAM for the FPGA,needs to be loaded with given configuration data for configuring the programmable resources of the FPGA. At power-up, configuration data is downloaded from, for example an EEPROM, and loaded into the associated memory cells of the SRAM for driving the various programmable resources of the programmable gate array. In addressing the SRAM of the field programmable gate array. The memory cells for receiving configuration data are addressed in accordance with the memory map diagramed in FIG. 9. If the same addressing is used for retrieving configuration data from an EEPROM, then a corresponding linear address memory map would be required for allocating memory units of the EEPROM to the associated memory cells of the SRAM. However, such an addressing scheme leaves many locations of the EEPROM empty, as wasted memory space.

In accordance with the present invention, a new procedure is provided for allocating memory to associated programmable resources of a programmable gate array. By effectively folding the memory map of the known allocation procedure as described hereinbefore (FIG. 9), the new allocation procedure structures memory blocks of the "horizontal" programmable resources, per a new more densely populated memory map, adjacent associated memory blocks of corresponding "vertical" programmable resources (see FIG. 10). The folded memory allocation of the present invention provides for a more efficient utilization of memory and reduces the number of address bits required for addressing the memory.

Figure 11:
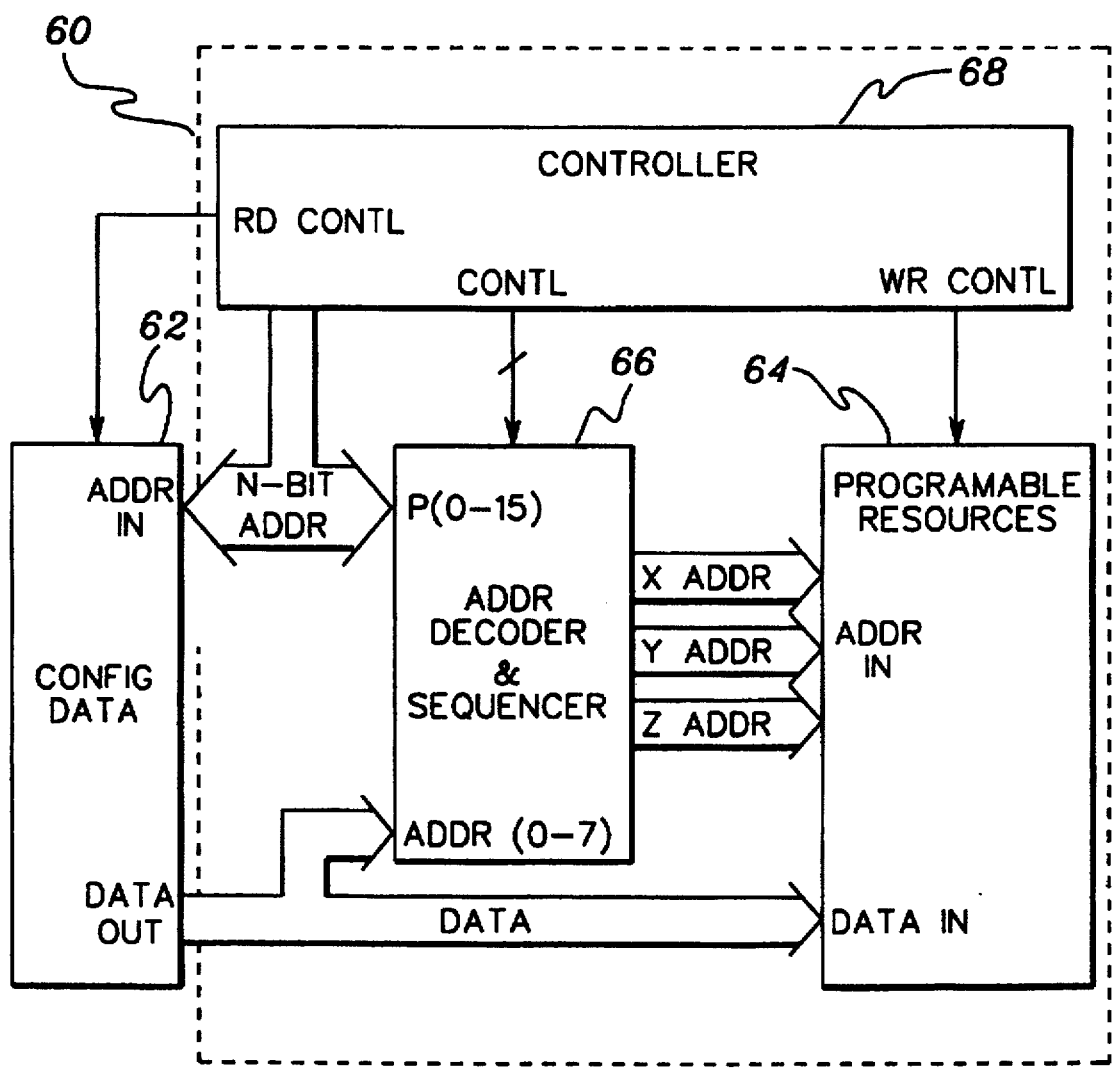
FIG. 11 is a block diagram of a field programmable gate array with controller and decoder for loading configuration data from external memory.

Before describing the resulting memory allocation of the present invention, hardware circuitry is characterized with reference to FIG. 11. The hardware circuitry provides address decoding as necessary so as to effectively fold the memory map associated with allocating memory to programmable resources of, for example, a field programmable gate array.

With reference to FIG. 11, field programmable gate array 60 presents an N-bit address to memory device 62, for example an EEPROM, and receives configuration data from the EEPROM for configuring the programmable gate array. Controller 68 presents a start address at power-up for addressing EEPROM 62. Configuration data from the addressed memory units of the EEPROM is then transferred to, for example, SRAM 64 for configuring the programmable resources of the field programmable gate array, FPGA. Address decoder 66 receives the N-bit addresses from the data stream, as first and second start bytes, followed by first and second end bytes, and decodes the N-bit addresses into respective x,y and z addresses for addressing SRAM 64. In test (mode 7) operation, addresses P(0–15) are supplied to the FPGA and decoded to provide respective x,y,z addresses. A primary feature of the present invention resides in the manner in which the address decoder 66 decodes the N-bit address into respective x, y and z portions for accessing a three-dimensional addressable array of programmable resources 64.

In a given embodiment of the present invention, the N-bit address comprises 16 bits. The 16 bit address is divided into four different portions: a first portion comprises address bits 0–6, a second portion comprises address bit 7, a third portion comprises address bits 8–13, and a fourth portion comprises address bits 14 and 15. The first and third portions of the N-bit address are used for addressing either the x dimension (bit) or y dimension (word) of an x,y,z addressable memory map of an SRAM in accordance with the state of the seventh bit. If address bit 7 is low, then address bits 0–6 are employed for addressing the y dimension (word) of the x,y,z addressable memory map while address bits 8–13 are used for addressing the x dimension (bit) of the SRAM memory map. On the other hand, if address bit 7 is high, then address bits 0–6 are designated for addressing the x dimension while address bits 8–13 are employed for addressing the y dimension of the memory map. By folding the continuous addressing structure in accordance with the seventh address bit, as described herein, the x,y,z addressable memory map of FIG. 9 is effectively folded to provide a modified memory map, as diagramed in FIG. 10, for allocating configuration data for the programmable resources of the FPGA.

Figure 10:
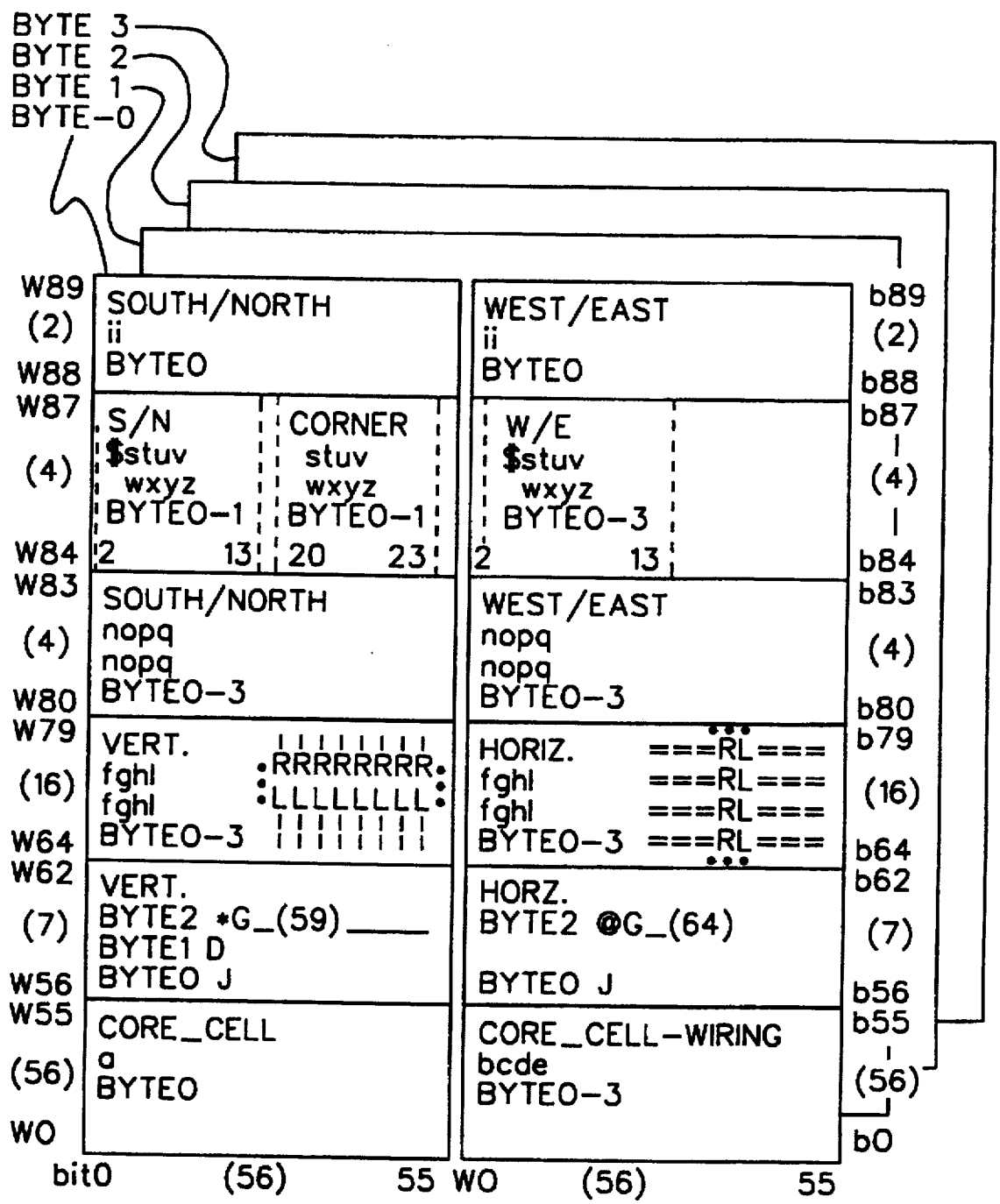
FIG. 10 shows a memory map for allocating memory cells to programmable resources of a field programmable gate array.

With reference to FIG. 10, when address bit 7 is low, address bits 0–6 are employed for addressing the y dimension of the SRAM memory map (from word 0 through word 89), and address bits 8 through 13 are employed for addressing the x dimension of the SRAM memory map (from bit 0 through bit 55). This portion of the memory map is illustrated by the left column in FIG. 10. Alternatively, when address bit 7 is high, address bits 0–6 are used for addressing the x dimension of the SRAM memory map (from bit 0 through bit 89), while address bits 8–13 are employed for addressing the y dimension of the SRAM memory map (from word 0 through word 55). This portion of the memory map is represented by the right column in FIG. 10. By folding the continuous address structure, the associated memory map for allocating configuration data for the "vertical" programmable resources of the FPGA is effectively stacked symmetrically beside the associated memory map for allocating configuration data for the "horizontal" programmable resources. The new address structure reduces the number of empty memory spaces, thus providing a more densely populated memory map addressable with fewer address bits.

As described above, address decoder 66 (as shown in FIG. 11) decodes the N-bit address, in accordance with the state of the seventh bit address, for designating which portions of the N-bit address to allocate to the x and y addresses of the SRAM memory map. Address decoder 66 analyzes the seventh bit of the N-bit address and accordingly allocates address bits 0–6 and 8–13 as respective x and y, or y and x, addresses of the SRAM array in accordance with the state of the seventh bit. Address bits 14 and 15 are passed forward for addressing the z dimension (bytes 0–3) of the SRAM memory map.

With reference to FIG. 10, the left column of the logical bit map has symmetrical memory block allocations with respect to the right column of the SRAM logical bit map. The configuration data C for programming the logic within the logic cells of the FPGA is allocated in the memory block from bits 0–55 and words 0–55. The configuration data W for the core cell wiring occupies a block in the memory map spanning words 0–55 and bits 0–55 as diagramed in the right column of the logical bit map. The core cell wiring configuration data W fills the z dimension along bytes 0 through bytes 3; whereas, the core Cell logic configuration data C occupies only byte 0 of the z dimension.

Moving up the logical bit map diagramed in FIG. 10, the configuration data J,D for programming the respective jumper and distribution vertical resources of the field programmable gate array are allocated in the memory block spanning bit 0–55 and word 56–62. The jumper configuration data J is in byte 0 of the z axis while the distribution configuration data D is allocated in byte 1. The configuration data ,G for the global distribution resources for each column, is allocated in the memory map from bit 0–55 at word 59 and byte 2.

Symmetrically arranged with the vertical programmable resources are the horizontal programmable resources of the field programmable gate array. The configuration data J for the horizontal jumpers is allocated in the memory block from word 0–55, bit 56–62, byte 0 of the right column diagramed in FIG. 10. The 7 jumpers per row correspond to the 7 locations from bit 56 and to bit 62. The 56 rows of the field programmable gate array correspond to word 0 through word 55. Also included in this particular memory block at byte 2 of the z-axis is the configuration data @G for the one extra global clock/reset distribution resource. Note the similar size of the memory blocks between the vertical and horizontal programmable resources between the left and right columns. The configuration data for the vertical resources sequenced from word 56 through word 62 on the left hand side occupy an equivalent space as the configuration data for the horizonal programmable resources from bit 56 through bit 62.

Similar symmetrical memory block allocations are provided for the configuration data of the additional vertical and horizontal programmable resources of the field programmable gate array: repeater groups (R), latches (L), I/O bus turns and multiplexers (M), I/O configurations (I represented by ii), and the I/O bus repeaters (B). The configuration data B, bytes "stuv wxyz", for the I/O bus repeaters are not allocated equivalently between the left and right columns of FIG. 10. The configuration data B for the corner bus repeaters, as represented by data bytes "stuv" and "wxyz", is allocated in the memory block from bit 20 through bit 23 and word 84 through word 87.

Again, configuration data is allocated to the programmable resources of the programmable logic array in accordance with the memory map diagramed in FIG. 10. When address bit 7 is low, address bits 0–6 are employed for addressing word 0 through word 89, while address bits 8–13 are employed for addressing bit 0–55. On the other hand, when address bit 7 is high, address bits 8–13 are available for addressing word 0–55 while address bits 0–6 are available for addressing bits 0–89. Address bits 14 and 15 are employed for addressing the z dimension byte 0 through byte 3. Accordingly, it can be seen that the 16 address bits, when folded and allocated in accordance with the state of address bit 7, are sufficient for addressing the x,y,z-addressable array of programmable resources of the field programmable gate array. In this fashion, the number of address bits required for accessing memory associated with a field programmable gate array has been reduced by one. In addition, it can be seen that the horizontal and vertical resources of the field programmable gate array can be accessed similarly along respective x and y dimensions given that they have symmetrical and corresponding memory block sizes within the folded logic bit map as diagramed in FIG. 10.

As mentioned hereinbefore with reference to FIG. 11, at power-up, programmable gate array 64 receives configuration data from external memory, EEPROM 62, in order to configure the various logic cells, interconnects, and I/O ports of the field programmable gate array. During power-up, controller 68 enables the address decoder and sequencer 66 for sequencing through the addresses associated with the memory blocks diagramed in FIG. 10. During test operation (mode 7) each address is decoded from P(0–15). The various states of the sequencer 66 and the corresponding memory address sequences generated are outlined in the table of FIG. 12.

Starting at state SC0, the sequencer 66 sequences the N-bit address through the respective start and end addresses for spanning bit 0–55, word 0–55, byte 0 and transferring associated configuration data C of the respective EEPROM 62 locations to corresponding programmable resources 64 (SRAM locations) of the programmable gate array 60 for configuring logic of the respective logic cells. In this fashion, the logic resources of each logic cell are configured in accordance with the associated configuration data of EEPROM 62.

When the end address of one state is reached, the sequencer jumps to the start address of the subsequent state. The programmable wiring resources of each logic cell are configured via the associated configuration data of EEPROM 62 as obtained from the memory block identified by the start and stop addresses of state Sc1. In similar fashion, the remaining programmable resources of the field programmable gate array are programmed as the sequencer continues through states SJ0 through SI1 as diagramed in FIG. 12.

Accordingly, what has been disclosed is a method and apparatus for folding a continuous address structure associated with programmable resources of a field programmable gate array. In addition, the address folding enables vertical and horizontal resources of a field programmable gate array to be programmed similarly per symmetrical memory block allocations. Finally, by incorporating the address folding structure in accordance with the present invention, the number of bits required for addressing memory allocated to the programmable resources of the programmable gate array can be reduced from that which would be required should the memory be addressed linearly in accordance with the respective dimensions of the programmable array.

It will be apparent to one skilled in the art, that the specific programmable resources of the programmable gate array may change yet still benefit from allocating memory in accordance with an address folding technique as identified by the present invention. Furthermore, the number of address bits provided to the external memory and/or the programmable gate array need not be set in accordance with the examples illustrated hereinbefore, the number of address bits could change without departing from the true spirit and scope of the present invention.

Finally, the programmable gate array as identified in the embodiments hereinbefore was described with SRAM memory cells driving respective controllable resources of the programmable gate array. It will be understood by one skilled in the art, that other programmable gate arrays could be similarly addressed for programming without departing from the scope of the present invention. It is merely required that the programmable resources be addressable in accordance with an x,y array and programmable in accordance with associated configuration data of memory external to the programmable gate array. For example, the programmable resources 64 could be a mask layout that is customized to provide a given configuration for a gate array. The mask layout would be selectively customized, at known x,y addressable locations, to provide selective deposition of certain layers of metallization for the gate array, in accordance with configuration data of an associated addressable data source. The configuration data would drive the customization of the mask layout so as to provide select resources for the gate array. The configuration data would be retrieved from a data source as addressed by an N-bit address. An address decoder and sequencer would decode the N-bit address, or provide a sequence of N-bit addresses for decode, into respective x,y portions, per the address folding procedure of the present invention, for addressing select positions of the mask layout to be customized in accordance with the associated configuration data.

While the invention has been particularly shown and described with reference to preferred embodiments thereof, it will be understood by those skilled in the art that various other changes in form and details may be made therein without departing from the spirit and scope of the invention.

What is claimed is:

1. In a computing system having a plurality of addressable memory units and a plurality of controllable resources arranged in a two-dimensional array, individual ones of the plurality of controllable resources having an associated one of the plurality of memory units corresponding thereto, the plurality of memory units having an N-bit address associated therewith, a method for associating the plurality of memory units to the plurality of controllable resources comprising:

using first, second and third portions of the N-bit address, the first and third portions each being switchably associated with a respective one of the two dimensions of the two-dimensional array, the second portion being employed for determining which of the two dimensions each of the first and third portions is associated with.

2. The method of claim 1 wherein at least one of the plurality of programmable resources comprises a plurality of individual programmable resources and the associated at least one of the plurality of memory units comprises a plurality of individual memory units and wherein individual ones of the plurality of individual programmable resources has a respective one of the plurality of individual memory units corresponding thereto, and wherein the using step further comprises:

using a fourth portion of the N-bit address, the fourth portion being employed for addressing the respective one of the plurality of individual memory units.

3. The method of claim 1 wherein the computing system comprises a field-programmable gate array and wherein the plurality of memory units comprises an SRAM of said field-programmable gate array.

4. A method of allocating memory to a programmable gate array having a plurality of programmable resources addressable per an x,y two-dimensional array, said method comprising steps of:

providing a plurality of addressable memory units addressable by an N-bit address, said N-bit address having first, second and third portions;

switchably associating the first and third portions of said N-bit address to respective x and y dimensions of the x,y two-dimensional array of the plurality of programmable resources in accordance with the second portion; and allocating memory units of the plurality of addressable memory units as addressed by said N-bit address to respective programmable resources of the plurality of programmable resources within the x,y two-dimensional array as addressed by the first and third portions of said N-bit address.

5. A method according to claim 4, wherein a programmable resource of the plurality of programmable resources at a given location of the x,y two dimensional array has a plurality of individual programmable resources addressable along a third z dimension;

wherein the N-bit address comprises a fourth portion and wherein said step of using further comprises using said fourth portion of said N-bit address;

said method further comprising a step of associating the fourth portion of said N-bit address to the third z dimension of the plurality of individual programmable resources; and wherein said step of allocating includes allocating memory units as addressed by said N-bit address to respective individual programmable resources of said plurality of individual programmable resources along the third z dimension at said given location of the x,y two-dimensional array as addressed by the fourth portion of said N-bit address.

6. A method according to claim 4, wherein the plurality of programmable resources of the programmable gate array includes:

electrically controllable resources; and a programmable SRAM having memory cells coupled for driving the respective electrically controllable resources, the memory cells being addressable per an x,y two-dimensional array;

wherein said step of allocating includes allocating memory units of the plurality of addressable memory units as addressed by said N-bit address to respective memory cells of the programmable SRAM, the first and third portions of the N-bit address switchably corresponding to respective x and y dimensions of the x,y two-dimensional array, the-correspondence of the first and third portions being switched in accordance with the second portion of said N-bit address.

7. A method according to claim 6 further comprising the step of:

(a) addressing the plurality of addressable memory units with a given N-bit address;

(b) addressing the memory cells of the programmable SRAM, using the first and third portions of said given N-bit address to address respective x and y, or y and x, dimensions of the x,y two dimensional array in accordance with the second portion of said given N-bit address; and (c) transferring data of said addressed memory unit of the plurality of addressable memory units to said addressed memory cell of the programmable SRAM.

8. A method according to claim 7 further comprising the steps of repeating steps a, b and c, a plurality of times with different N-bit addresses until having programmed all the memory cells of the programmable SRAM.

9. A method according to claim 6, wherein the electrically controllable resources include configurable logic resources and wiring resources.

10. A computing system comprising:

a plurality of programmable resources addressable per an x,y two-dimensional array;

a plurality of addressable memory units addressable per an N-bit address;

means for addressing the plurality of addressable memory units per a given N-bit address;

means for using first, second and third portions of said N-bit address; and means for switchably addressing respective x and y addressable dimensions of the x,y two-dimensional array of the plurality of programmable resources with the first and third, or the third and first, portions respectfully of said given N-bit address in accordance with the second portion of said given N-bit address.

11. A computing system according to claim 10, wherein said plurality of programmable resources comprises a programmable gate array.

12. A computing system according to claim 11, wherein said programmable gate array includes:

electrically controllable resources; and a programmable SRAM having memory cells coupled for driving the respective electrically controllable resources, the memory cells being addressable per an x,y two-dimensional array;

wherein said means for switchably addressing addresses respective x and y addressable dimensions of the programmable SRAM with the first and third, or the third and first, portions respectfully of said given N-bit address in accordance with the second portion of said given N-bit address.

13. A computing system according to claim 12 further comprising means for transferring data of a memory unit of the plurality of addressable memory units, as addressed per said given N-bit address, to a memory cell of said programmable SRAM, as addressed, per the first and third portions of said given N-bit address.

14. A computing system according to claim 13 further comprising means for generating a sequence of N-bit addresses so that all memory cells of said programmable SRAM may be programmed.

15. A computing system according to claim 10, wherein a programmable resource of the plurality of programmable resources at a given location of the x,y two dimensional array has a plurality of individual programmable resources addressable along a third z dimension;

said using means includes means for using a fourth portion of said given N-bit address; and said addressing means includes means for addressing the addressable third z dimension of said plurality of programmable resources per the fourth portion of said given N-bit address.

16. A computing system according to claim 15, wherein said plurality of programmable resources comprises a programmable gate array.

17. An improved computing system having:

a field programmable gate array including a plurality of programmable resources addressable per respective x and y addresses of an x,y two-dimensional array;

memory means including a plurality of memory units for storing configuration data of the field programmable gate array, the plurality of memory units being addressable per an N-bit address, the programmable resources of the plurality of programmable resources being associated with respective memory units of the plurality of memory units; and address means for addressing a programmable resource and a respective memory unit simultaneously for enabling transfer of configuration data from the memory unit to its associated programmable resource;

wherein the improvement comprises means within the address means for dividing the N-bit address of the plurality of memory units into using first, second and third portions of the N-bit address, including means for using said first and third portions interchangeably, as a function of a value stored in said second portion, as the x and y, or y and x, addresses respectively for addressing the plurality of programmable resources.

18. A computing system according to claim 17, wherein a programmable resource of the plurality of programmable resources at a given x and y address of the x,y two-dimensional array includes a plurality of individual programmable resources addressable per a third z address; and wherein said address means includes means for using a fourth portion of the N-bit address and employing said fourth portion as said third z address for addressing the plurality of individual programmable resources.

* * * * *

UNITED STATES PATENT AND TRADEMARK OFFICE
CERTIFICATE OF CORRECTION

PATENT NO. : 5,692,147
DATED : Nov. 25, 1997
INVENTOR(S) : Larsen et al.

It is certified that error appears in the above-identified patent and that said Letters Patent is hereby corrected as shown below:

Column 20, lines 27-28, claim 17,     delete --dividing the N-bit address of the plurality of memory units into--.

Signed and Sealed this

Sixteenth Day of June, 1998

Attest:

BRUCE LEHMAN

Attesting Officer     Commissioner of Patents and Trademarks